(12) United States Patent
Krivokapic

(10) Patent No.: US 6,703,304 B1
(45) Date of Patent: Mar. 9, 2004

(54) DUAL DAMASCENE PROCESS USING SELF-ASSEMBLED MONOLAYER AND SPACERS

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/772,597

(22) Filed: Jan. 30, 2001

(51) Int. Cl.⁷ .......................................... H01L 21/4763
(52) U.S. Cl. ....................................... 438/637; 438/638
(58) Field of Search ................................. 438/668, 639, 438/637, 638, 622

(56) References Cited

U.S. PATENT DOCUMENTS

| | | | |
|---|---|---|---|
| 4,728,591 A | | 3/1988 | Clark et al. |
| 4,832,789 A | * | 5/1989 | Cochran et al. ............ 156/644 |
| 5,079,600 A | | 1/1992 | Schnur et al. .................. 357/4 |
| 5,512,131 A | | 4/1996 | Kumar et al. |
| 5,512,328 A | | 4/1996 | Yoshimura et al. |
| 5,514,501 A | | 5/1996 | Tarlov |
| 5,618,760 A | | 4/1997 | Soh et al. |
| 5,725,788 A | | 3/1998 | Maracas et al. |
| 5,727,977 A | | 3/1998 | Maracas et al. .............. 445/24 |
| 5,751,018 A | | 5/1998 | Alivisatos et al. |
| 5,885,753 A | | 3/1999 | Crooks et al. |
| 5,922,214 A | | 7/1999 | Liu et al. |
| 5,981,350 A | * | 11/1999 | Geusic et al. ................ 438/386 |
| 6,048,623 A | | 4/2000 | Everhart et al. |
| 6,071,812 A | * | 6/2000 | Hsu et al. ..................... 438/668 |
| 6,087,231 A | | 7/2000 | Xiang et al. ................. 438/287 |
| 6,114,099 A | * | 9/2000 | Liu et al. ..................... 430/324 |
| 6,174,775 B1 | | 1/2001 | Liaw ........................... 438/283 |
| 6,174,804 B1 | * | 1/2001 | Hsu ............................. 438/638 |
| 6,184,126 B1 | * | 2/2001 | Lee et al. ..................... 438/637 |
| 6,187,657 B1 | | 2/2001 | Xiang ........................... 438/596 |
| 6,225,658 B1 | | 5/2001 | Watanabe ..................... 257/296 |
| 6,238,982 B1 | | 5/2001 | Krivokapic et al. ......... 438/275 |
| 6,262,456 B1 | | 7/2001 | Yu et al. ...................... 257/371 |
| 6,297,169 B1 | | 10/2001 | Mangat et al. |
| 6,365,466 B1 | | 4/2002 | Krivokapic |
| 6,380,101 B1 | | 4/2002 | Breen et al. |
| 6,413,587 B1 | | 7/2002 | Hawker et al. |
| 6,534,399 B1 | * | 3/2003 | Krivokapic .................. 438/638 |
| 2001/0039114 A1 | * | 11/2001 | Nakamura .................. 438/638 |

FOREIGN PATENT DOCUMENTS

KR 325465 * 2/2002 ............ H01L/21/28

OTHER PUBLICATIONS

Lu et al., Ultrathin resist films patterning using a synchrotron radiation lithography system, Sep. 7, 1996, pp. 103–105.

Huang et al., Photopatterning of Self–Assembled Alkanethiolate Monolayers on Gold: A Simple Monolayer Photoresist Utilizing Aqueous Chemistry, Jan. 7, 1994, pp. 626–628.

Aoki et al., Molecular Patterning using Two–Dimensional Polymer Langmuir–Blodgett Films, Advanced Materials 1997, 9, No. 4, pp. 361–364.

Oh et al., Fabrication and Photodegradation Behavior of Photosensitive Polyimide LB Film, Mol. Cryst. and Liq. Cryst. 2001, vol. 370, pp. 169–172.

(List continued on next page.)

Primary Examiner—Amir Zarabian
Assistant Examiner—Pamela E Perkins
(74) Attorney, Agent, or Firm—Foley & Lardner

(57) ABSTRACT

A method of fabricating a trench on an integrated circuit having first and second insulative layers includes providing a layer of material over the insulative layers; forming a first self-assembled monolayer on the layer of material; etching the first self-assembled monolayer to form an aperture in the layer of material; etching the first insulative layer through the first aperture, wherein a top surface of the second insulative layer is exposed; depositing a spacer layer over the layer of material, wherein a portion of the spacer layer masks a portion of the top surface of the second insulative layer; and etching the second insulative layer.

22 Claims, 7 Drawing Sheets

OTHER PUBLICATIONS

Iwamoto et al., Fine Patterns of Positive–Working Resists Using a Polyimide Langmuir–Blodgett Film System, Japanese Journal of Applied Physics, vol. 30, No. 2A, Feb., 1991, pp. L218–L221.

U.S. Publication No. US 2001/000629 A1, filed May 3, 2001, by Tsukamoto, entitled "Semiconductor Device and Process of Producing the Same".

Joanna Aizenberg, Andrew J. Black and George M. Whitesides, Controlling local disorder in self–assembled monolayers by patterning the topography of their metallic supports, Nature, Aug. 27, 1998, pp. 868–871.

Self–Assembled Monolayers, printed from Internet address: http://www.ifm.liu.se/applphys/molfil...ject/monolayer-structure/sam/sams.html on Oct. 9, 2000, 5 pages.

Self–assembled mono–multilayers, printed from Internet address: http://www.inapg.inra.fr/ens_rech/siab/asteq/elba/salayers.htm on Nov. 14, 2000, 3 pages.

Thin Semiconductor Layers Prepared from Langmuir–Blodgett Precursor, printed from Internet address: http://www.foresight.org/Conferences/MNT6/Papers/Erokhin/ on Nov. 14, 2000, 9 pages.

Monolayer Basics, printed from Internet address: http://www.langmuir–blodgett.com/basics/faq1.htm on Nov. 14, 2000, 6 pages.

Monolayer History, printed from Internet address: http://www.langmuir–blodgett.com/basics/faq2.htm on Nov. 14, 2000, 3 pages.

Langmuir Blodgett Assembly, printed from Internet address: http://mmpwww.ph.qmw.ac.uk/lbassem.html on Nov. 14, 2000, 2 pages.

"Fabrication of Gold Nanostructures by Lighography with Self–Assembled Monolayers," IBM Technical Disclosure Bulletin, vol. 39, No. 12, Dec. 1996.

* cited by examiner

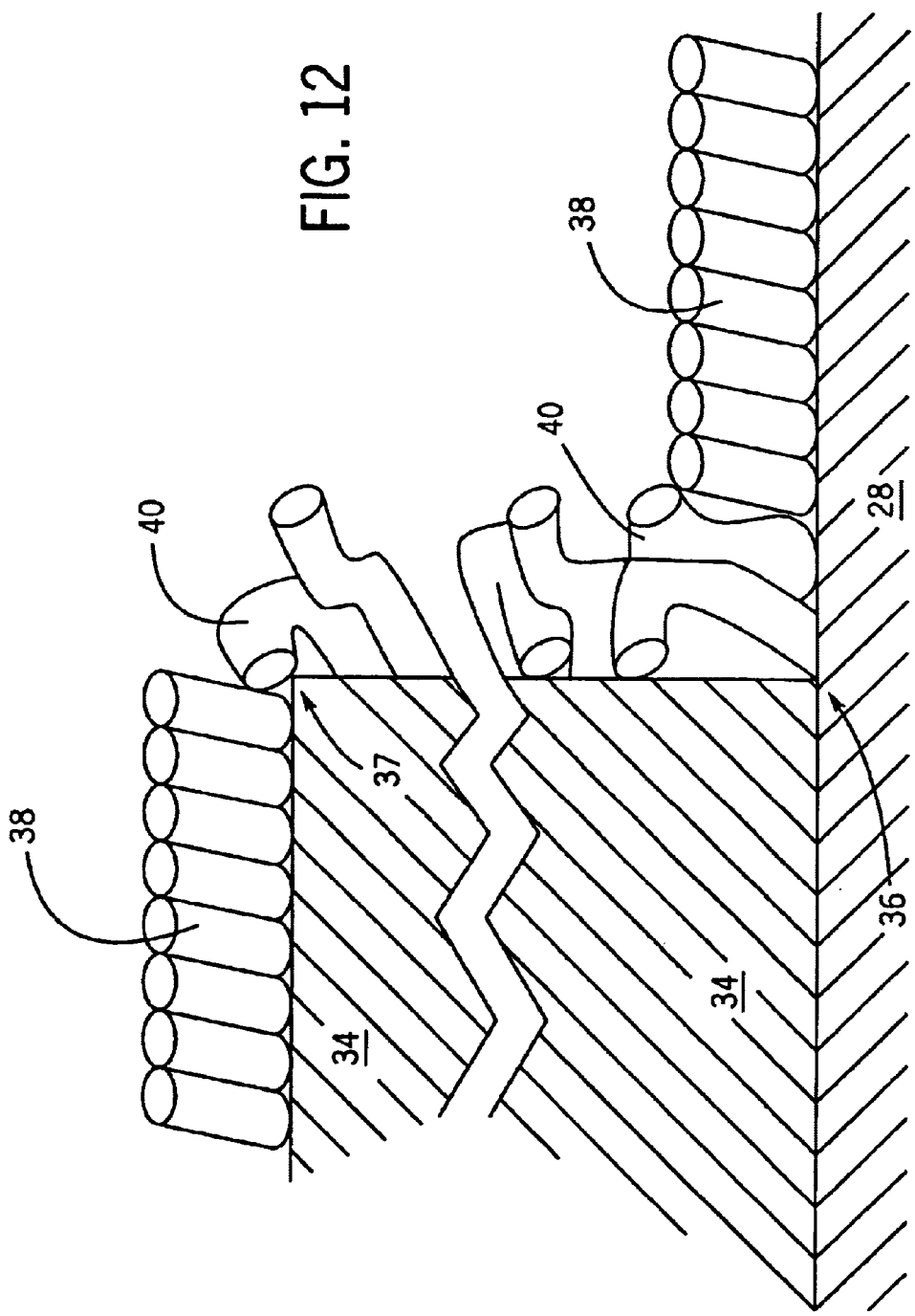

DUAL DAMASCENE PROCESS USING SELF-ASSEMBLED MONOLAYER AND SPACERS

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present specification relates generally to a process of forming a trench for an integrated circuit and, more specifically, to a dual damascene process of forming a trench for an integrated circuit (IC). Even more specifically, the present specification relates to a dual damascene process that uses a self-assembled monolayer and a spacer.

BACKGROUND OF THE INVENTION

The increased demand for higher performance integrated circuit (IC) devices has required the density of metallization lines to be increased and, in addition, has required the use of stacked layers to be increased. These requirements have necessitated the development of novel approaches in the methods of forming interconnections that not only integrate fine geometry definition but are also conducive to subsequent CMP (chemical mechanical polishing) processing. CMP is necessary to ensure that a subject layer is flat (surface uniformity) and planar enough to serve as a bottom layer for an additional layer.

As interconnection line widths shrink, the challenges of etching materials using photoresist-as-mask techniques have become increasingly difficult. A major cause of the difficulty is the large aspect ratios involved. The aspect ratio is the ratio of the depth of a feature being etched to the width of the feature (D/W) (or height-to-width in cross-section).

One method of forming a trench is a method known as a damascene process, which comprises forming a trench by masking and etching techniques and subsequent filling of the trench with the desired conductive material. The damascene process is a useful method for attaining the fine geometry metallization required for advanced semiconductor devices. A dual damascene process is a two-step sequential mask/etch process to form a two-level structure, such as a via, connected to a metal line above the via.

Conventional dual damascene processing technology entails depositing a triple layer sandwich consisting of a thick layer of an insulative material, an etch stop material having a high etch selectivity to the insulative layer, and a second thick layer of an insulative material. The two level structure is formed by masking and etching through the top layer of insulative material stopping on the layer of etch stop material, etching the etch stop material only, then performing a second masking and etching process in the top layer of insulative material only. The second mask and etch provides a larger trough than the first mask and etch with the second masking being an oversize masking.

The demand for increased density has required an increase in the aspect ratio of the photolithographic processes. However, the current dual damascene process has several problems that prevent the further increase of the aspect ratio. The lithography systems being used to expose the photoresist in the resist-as-mask process are limited by the wavelength of light used, the compositions of the photoresist, and the lithographic techniques employed.

Accordingly, an improved method of fabricating a trench for an integrated circuit is needed. Further, a method of fabricating a trench for an integrated circuit having a smaller width than available with conventional dual damascene processes is needed. Further still, what is needed is a method of fabricating a trench for an integrated circuit having a width which is controllable to dimensions not possible using conventional dual damascene processes. Further yet, what is needed is a method of forming interconnect lines for an IC using less critical masks than in conventional dual damascene processes. Also, what is needed is a method of fabricating a trench having a high aspect ratio. The teachings hereinbelow extend to those embodiments which fall within the scope of the appended claims, regardless of whether they accomplish one or more of the above-mentioned needs.

SUMMARY OF THE INVENTION

According to an exemplary embodiment, a method of fabricating a trench for an integrated circuit having first and second insulative layers includes providing a layer of material over the insulative layers. The method further includes forming a first self-assembled monolayer on the layer of material and etching the first self-assembled monolayer to form an aperture in the layer of material. The method further includes etching the first insulative layer through the first aperture. A top surface of the second insulative layer is exposed. The method further includes depositing a spacer layer over the layer of material. A portion of the spacer layer masks a portion of the top surface of the second insulative layer. The method further includes etching the second insulative layer.

According to another exemplary embodiment, a method of fabricating a trench for an integrated circuit includes providing first and second insulative layers over a semiconductor substrate and fabricating a layer of material having a topographical transition region over the first insulative layer. The method further includes forming a self-assembled molecular layer over the layer of material. The self-assembled molecular layer has a region of etch selectivity at the topographical transition region. The method further includes etching the self-assembled molecular layer at the region of etch selectivity to form an aperture in the layer of material and etching the first insulative layer to form a first portion of the trench. The method further includes depositing a spacer layer over the layer of material and etching the spacer layer to expose a top surface of the second insulative layer. The method further includes etching the second insulative layer to form a second portion of the trench.

According to yet another exemplary embodiment, an integrated circuit has a trench. The trench is fabricated by providing first and second layers of material over a semiconductor substrate and providing a layer of material over the insulative layers. The trench is further fabricated by forming a first self-assembled monolayer on the layer of material and etching the first self-assembled monolayer to form an aperture in the layer of material. The trench is further fabricated by etching the first insulative layer through the first aperture. A top surface of the second insulative layer is exposed. The trench is further fabricated by depositing a spacer layer over the layer of material. A portion of the spacer layer masks a portion of the top surface of the second insulative layer. The second insulative layer is etched.

BRIEF DESCRIPTION OF THE DRAWINGS

The invention will become more fully understood from the following detailed description, taken in conjunction with the accompanying drawings, wherein like reference numerals refer to like parts, in which:

FIG. 12 is a schematic representation of a self-assembled monolayer on the integrated circuit of FIG. 1, according to an exemplary embodiment.

DETAILED DESCRIPTION OF EXEMPLARY EMBODIMENTS

Figure 1:
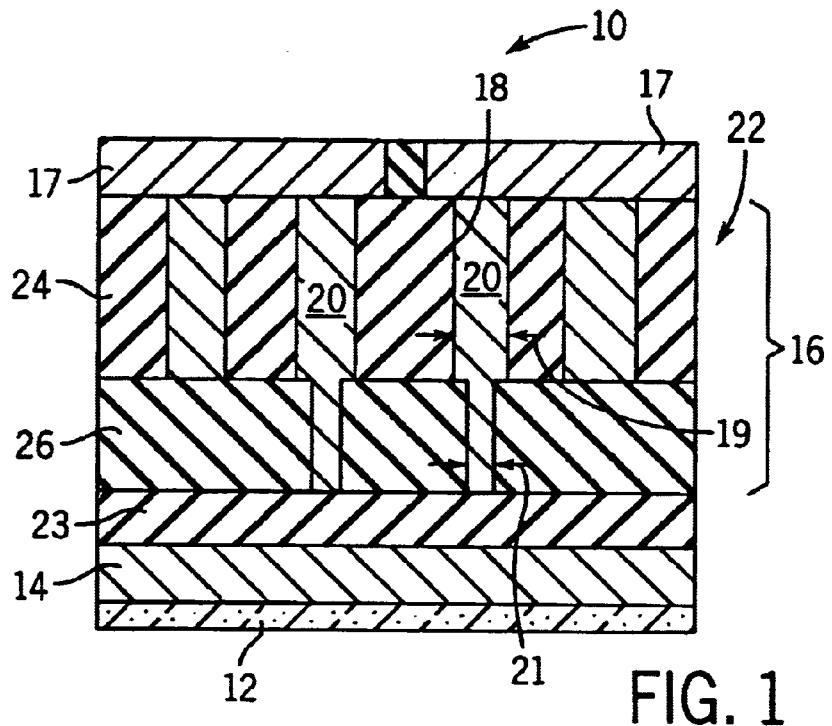
FIG. 1 is a schematic cross-sectional view of a portion of an integrated circuit, according to an exemplary embodiment.

Referring to FIG. 1, a portion 10 of an integrated circuit includes a substrate 12 (e.g., a semiconductor substrate), other fabricated layers 14 (e.g., transistors, capacitors, interconnects, contacts, or other devices) and an interconnect layer 16. Interconnect layer 16 selectively provides electrical isolation and electrical conductivity between fabricated layers 14 and additional layers above layer 14, such as, metal lines 17. Interconnect layer 16 includes a trench or via 18 filled with a conductive material 20, such as, a metal, tungsten, copper, etc. Trench 18 is located within an insulative layer 22 (e.g., a dielectric layer, such as, $SiO_2$, HSQ, porous oxide, etc.).

Insulative layer 22 can be a composite layer, including a first insulative layer 24 and a second insulative layer 26 in this exemplary embodiment. Additional layers of devices (e.g., transistors, etc.) may be provided above conductive material 20 and insulative layer 22, wherein conductive material 20 provides electrical connection between said additional layers and fabricated layers 14.

Portion 10 is fabricated using a dual damascene process in this exemplary embodiment, though alternative processes may be used. Trench 18, and, correspondingly, conductive material 20, has a depth of between 5,000 and 15,000 angstroms (Å), and a width 19 at first insulative layer 24 of approximately 1,200 Å, less than 2,000 Å, or between 40 and 70 nm. At second insulative layer 26, trench 18 has a width 21 of approximately 800 Å, less than 1,500 Å, or preferably between 30 and 50 nm. Advantageously, the width of trench 18 and conductive material 20 at first and second insulative layers 24 and 26 is smaller than that available using conventional dual damascene processes. For example, a conventional dual damascene process typically may achieve a width 21 of 2,500 Å at second insulative layer 36 and a width of 4,500 Å at first insulative layer 24. While the exemplary embodiment is illustrated with reference to interconnects or vias, the principles disclosed herein may alternatively be utilized for other trenches and other portions of an integrated circuit, or in other devices on an integrated circuit.

Figure 2:
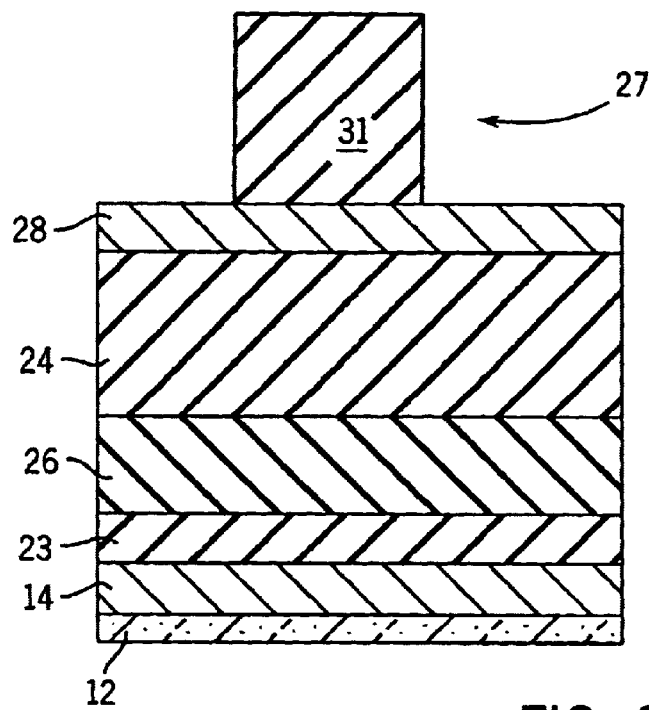
FIG. 2 is a schematic cross-sectional view of the integrated circuit of FIG. 1 illustrating a photoresist patterning step, according to an exemplary embodiment

Referring to FIGS. 1–12, a method of fabricating a trench on an integrated circuit will now be described. Referring first to FIG. 2, an optional thin etch stop layer 23 is provided over fabricated layer 14 to protect fabricated layer 14 from a subsequent etching step. Thin etch stop layer 23 may be a metal layer or cap layer, and has a thickness of between 10 and 30 nm, or preferably about 20 nm.

Using conventional deposition techniques, or other techniques, first and second insulative layers 24 and 26 are provided over etch stop layer 23. Insulative layers 24 and 26 are provided by chemical vapor deposition (CVD) or other deposition processes, and each has a thickness of between 5,000 Å and 10,000 Å. In this exemplary embodiment, first and second insulative layers 24 and 26 have different etch selectivities sufficient that an etch step may etch one of layers 24 and 26 without substantially affecting the other of layers 24 and 26. Preferably, an etch selectivity of at least 2:1 is present between layers 24 and 26. Exemplary materials for layers 24 and 26 include tetraethylorthosilicate-deposited silicon dioxide or other known insulative layers. Insulative layers 24 and 26 also preferably have different end point detection. By knowing when to stop etching between layers 24 and 26, the dimensions of the dual damascene process can be better defined.

Next, a layer of material 28, such as a metal layer, is provided over insulative layers 24 and 26. Layer 28 includes a substance suitable for adsorbing to a self-assembled molecule (e.g., a thiol) of a self-assembled molecular layer (e.g., a self-assembled monolayer, multilayer, etc.). Suitable substances include gold, silver, silicon dioxide, gallium, arsenide, etc. In this exemplary embodiment, a metal layer is utilized. Metal layer 28 will act as an anchor for a self-assembled molecular layer applied in a subsequent step. Metal layer 28 is preferably deposited with a thickness of between 50 and 80 nm.

Next, a layer of photoresist 27 is patterned (i.e., exposed and developed) over layer 28. Photoresist 27 may be a positive or negative photoresist, and is applied with a thickness of between 600 and 1000 nm with a standard spin-coating process. Photoresist 27 is exposed to a source of radiation (e.g., light, electron beam, etc.), such as, an excimer laser having a wavelength of 248 nm, 193 nm, 157 nm, or other wavelengths. Photoresist 27 is exposed to the radiation through a mask or reticle, such as a binary mask, attenuating phase-shift mask, alternating phase-shift mask, etc. The mask includes a pattern which includes a series of long, parallel trenches in this exemplary embodiment. One such trench is shown in cross-section in FIG. 2. A developer solution is applied to the exposed photoresist to remove portions of photoresist 27 in accordance with the mask pattern, whereby a photoresist feature 31 remains.

Figure 3:
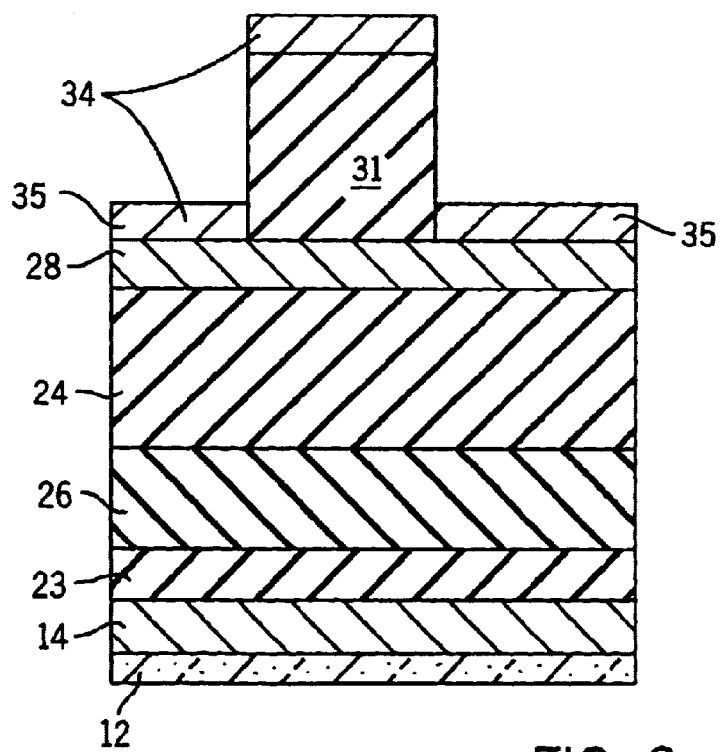
FIG. 3 is a schematic cross-sectional view of the integrated circuit of FIG. 1 illustrating a second layer providing step, according to an exemplary embodiment.

Referring now to FIG. 3, a topographical transition region is fabricated over insulative layer 24. A topographical transition region is any region (typically between two planar surfaces) suitable for creating disorder in a self-assembled molecular layer, as taught in J. Aizenberg et al., "Controlling local disorder in self-assembled monolayers by patterning the typography of their metallic supports", Nature, vol. 394, Aug. 27, 1998, pp. 868–871. A topographical transition region may be a corner, an etched edge, or other topographies between multiple layers of material or on one layer of material.

In this exemplary embodiment, a topographical transition region is a corner between two layers, wherein the layers may be the same or different materials. A second layer of material 34 is deposited over metal layer 28 and feature 31 by evaporation or another deposition process.

Figure 4:
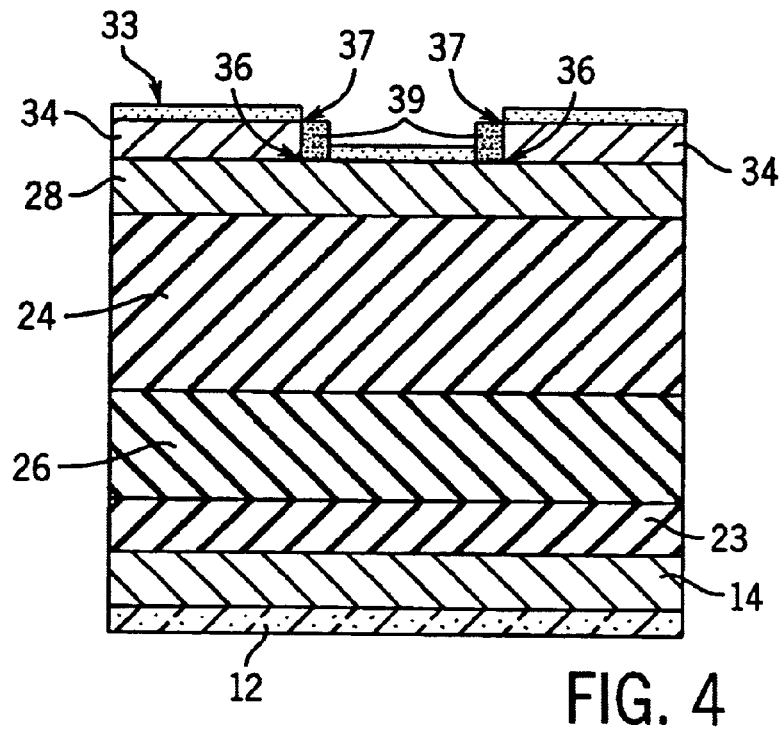
FIG. 4 is a schematic cross-sectional view of the integrated circuit of FIG. 1 illustrating a self-assembled molecular layer providing step, according to an exemplary embodiment.

Referring to FIG. 4, photoresist feature 31 and a portion of material 134 above feature 31 is removed (e.g., by etching) or lifted off (e.g., by evaporation). Layer 34 can alternatively be masked and etched to leave the pattern corresponding to features 35. Layer 34, like layer 28, is any material suitable for anchoring molecules used to form a self-assembled molecular structure. Second metal layer 34 and metal layer 28 form sharp edges 36 having a high height profile at the intersections thereof. In alternative embodiments, sharp edges 36 may have greater or lesser height profiles, depending upon the application. In this exemplary embodiment, a height profile of approximately 90 degrees is utilized. Layer 34 also has sharp edges 37, which may be ethched, having a similar height profile as sharp edges 36.

Metal layers 28 and 34 may be the same metals or different metals in alternative embodiments. Alternatively, other materials besides metal may be used, provided the materials provide a suitable base on which to form the self-assembled molecular layer. Further, other chemical structures besides thiols may be utilized for the self-assembled molecular layer. Various structures may be fabricated which substitute for sharp edges 36 in performing the function of providing a portion or site at which selective etching can be obtained.

A self-assembled molecular layer 33 is grown or adsorbed to portion 10. A self-assembled molecular layer is a layer of molecules which forms in a condition that will minimize its free energy. Typically, self-assembled molecules are very large molecules and their properties can be modified by chemical treatment during self-assembly. In this exemplary embodiment, each molecule having an alkane chain, typically with 10 to 20 methylene units. Each molecule has a head group with a strong preferential adsorption to the substrate used, in this case, layers 28 and 34. One suitable head group is a thiol (S—H) group which absorbs well to a material including gold or silver. Portion 10 is exposed to a thiol or other self-assembled molecular layer solution. The thiol molecules adsorb readily from a solution onto the gold, creating a dense monolayer with the tail group pointing outwards from the surface, typically at an angle. By using thiol molecules with different tail groups, the resulting chemical surface functionality can be varied. A longer self-assembled molecule is provided in this step.

As is known, longer self-assembled molecules make the portions having etch selectivity susceptible to etchants. Shorter self-assembled molecules make the portions having etch selectivity etch resistant. Either longer or shorter molecules may be used in different exemplary embodiments. Wet etchants are generally compatible with self-assembled molecules. In this exemplary embodiment, shorter molecules are used to form thin metal lines. Alternatively, longer molecules could be used with a negative image to form trenches.

With reference to FIG. 12, sharp edges 36 and 37 of layers 28 and 34 are illustrated after being exposed to thiol. According to one example, a 10 mM solution of $HS(CH_2)_{15}X(X=CH_3$ or $CO_2H)$ is provided to layers 28 and 34 in an ethanol solution for approximately one hour. A plurality of ordered alkanethiolates 38 are formed on layers 28 and 34. At sharp edges 36 and 37, disorder occurs in the self-assembled molecular layer, as illustrated by disordered alkanethiolates 40. Thus, by controlling the locations of disorder in alkanethiolates 38 by providing sharp edges 36 and/or 37, or other suitable topography, selectivity to a specific etching process can be obtained.

Referring again to FIG. 4, self-assembled molecular layer 33 includes disordered portions 39 comprising longer self-assembled molecules, whereby portions 39 are susceptible to an etching process, such as, wet etching.

Figure 5:
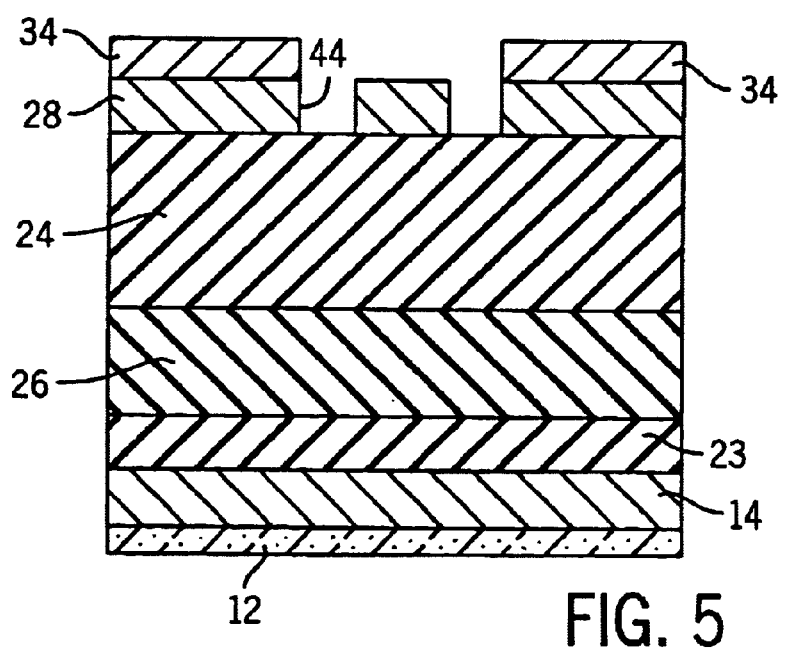
FIG. 5 is a schematic cross-sectional view of the integrated circuit of FIG. 1 illustrating a self-assembled molecular layer etching step, according to an exemplary embodiment.

Referring to FIG. 5, an etching step selective to disordered alkanethiolates 40 etches a trough 44 in metal layer 28. The width of trough 44 is controllable by varying the etching time. In one example, etch time may be approximately 10 seconds, or between 5 and 15 seconds. The width of trough 44 is between 40 and 60 nm, or less than 75 nm. Reference is made to J. Aizenberg et al., supra, for further alternatives.

Figure 6:
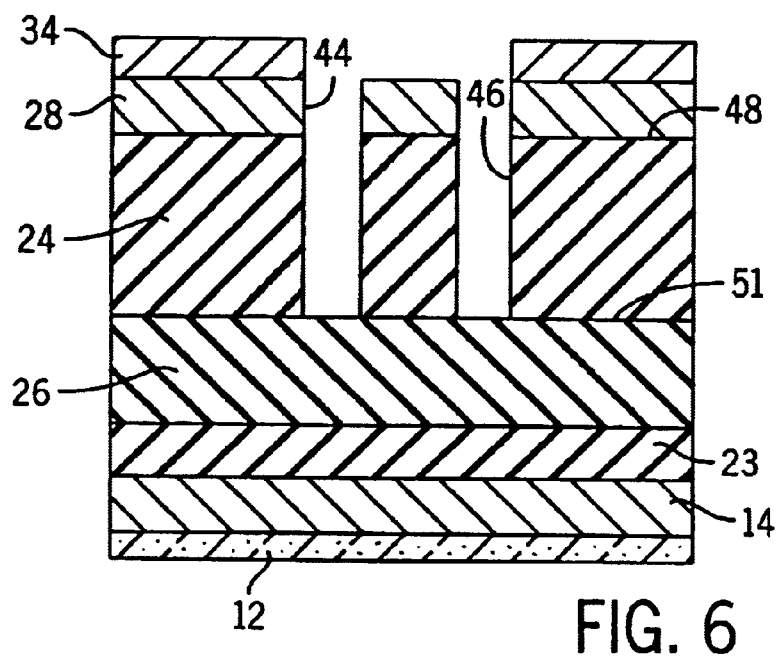
FIG. 6 is a schematic cross-sectional view of the integrated circuit of FIG. 1 illustrating an insulative layer etch step, according to an exemplary embodiment.

Referring to FIG. 6, metal layers 28 and 34 are then used as a hard mask for subsequent insulative layer etching. A first etch process has a high selectivity to insulative layer 24, and not to metal layers 28 and 34 or insulative layer 26, such that, insulative layer 24 is etched but metal layers 28 and 34 and insulative layer 26 is not etched. A long trench 46 is etched in insulative layer 24 extending from an upper surface 48 of dielectric layer 24 to an upper surface 51 of insulative layer 26. The width of trench 46 is preferably between 40 and 60 nm and the depth is preferably 200–500 nm.

Figure 7:
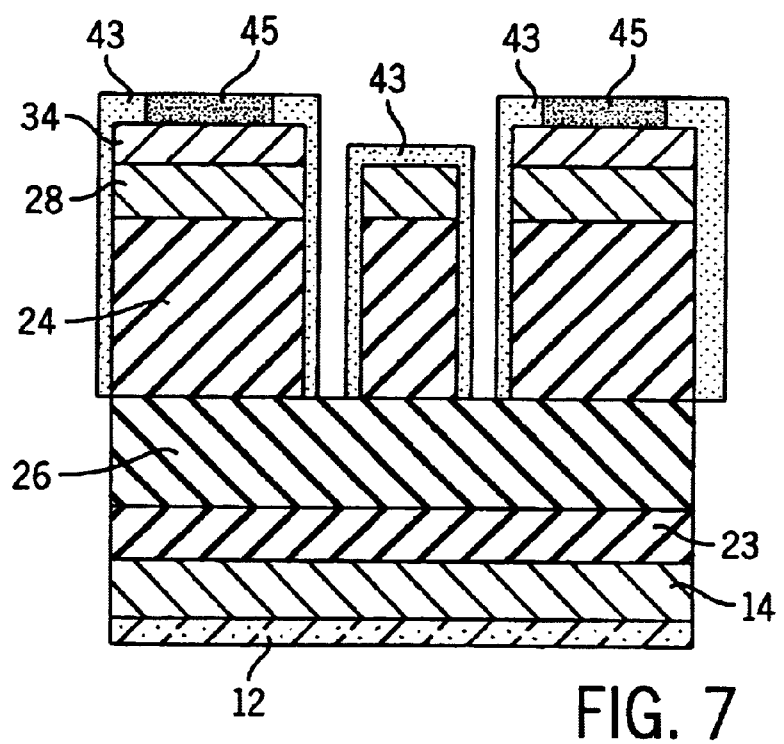
FIG. 7 is a schematic cross-sectional view of the integrated circuit of FIG. 1 illustrating a second self-assembled molecular layer providing step, according to an exemplary embodiment.

Referring now to FIG. 7, a second self-assembled molecular layer is provided over metal layers 28 and 34 by exposing layers 28 and 34 to a self-assembled molecular solution (e.g., including thiol). The second self-assembled molecular layer has ordered portions 43 and disordered portions 45. Ordered portions 43 are formed by self-assembled molecules exchanged with a short molecule, which serves as a resist for subsequent etching. Thus, ordered portions 43 protect the sidewalls of layers 24, 28, and 34.

Figure 8:
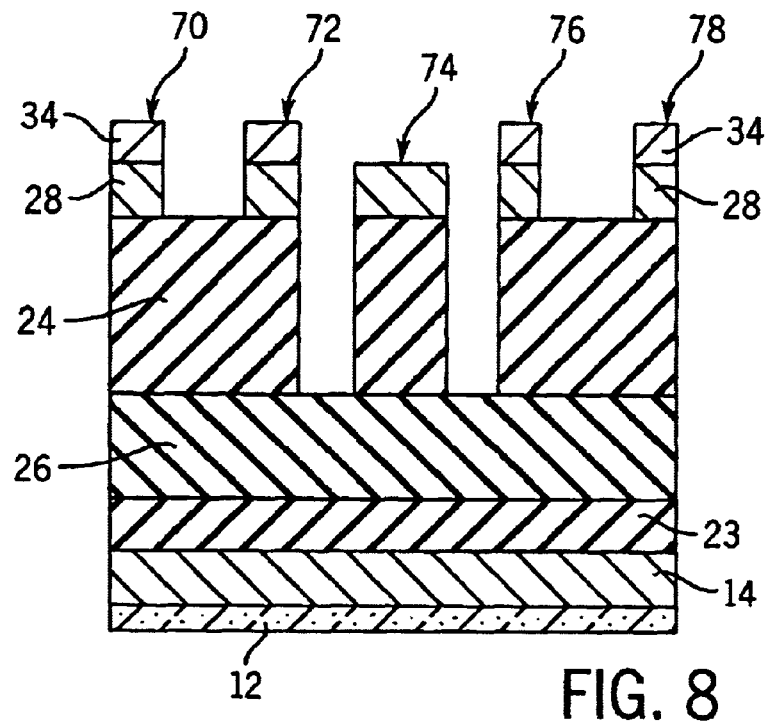
FIG. 8 is a schematic cross-sectional view of the integrated circuit of FIG. 1 illustrating a second etching step, according to an exemplary embodiment.

Referring to FIG. 8, an etch process of the self-assembled molecular layer 28 will etch away portions of layers 28 and 34 below disordered portions 45. The etch step etches away layers 28 and 34, but not layer 24, in this exemplary embodiment such that pillars 70, 72, 74, 76, and 78 are fabricated from layers 28 and 34. The widths of pillars 70, 72, 74, 76, and 78 are between 100–120 nm, but may be as small as 50 nm or less. Very thin pillars may only be limited in width by interconnect capacitance between adjacent lines.

Figure 9:
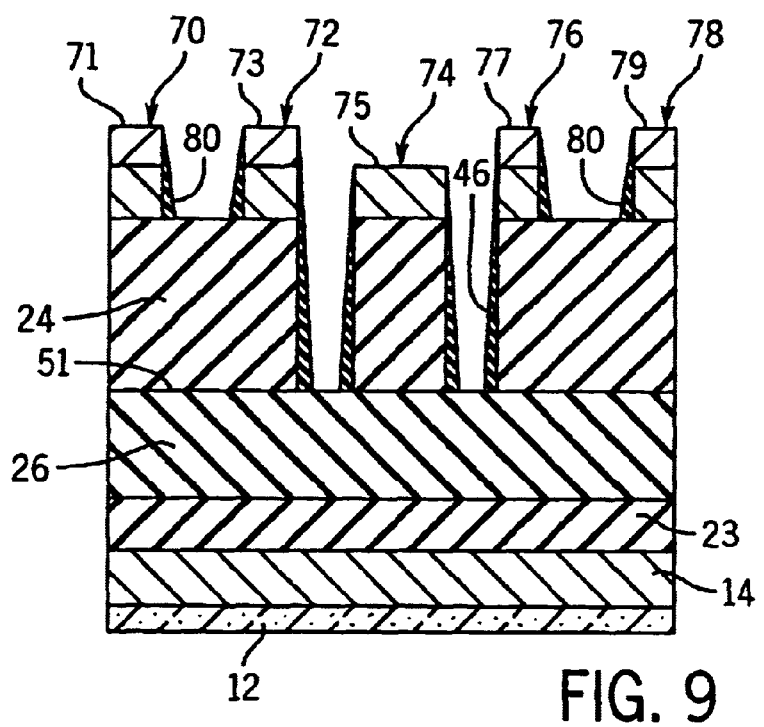
FIG. 9 is a schematic cross-sectional view of the integrated circuit of FIG. 1 illustrating a spacer layer providing step, according to an exemplary embodiment.

Referring to FIG. 9, a spacer layer 80 is provided over pillars 70, 72, 74, 76, and 78 and further over insulative layers 24 and 26. Spacer layer 80 is provided with a thickness of preferably between 20 and 40 nm, and comprises a metal in this exemplary embodiment. Spacer layer 80 is blanket etched to remove portions of the layer from top surface 51 of insulative layer 26 and from top surfaces 71, 73, 75, 77, and 79. The remaining portions of spacer layer 78 mask at least a portion of insulative layers 24 and 26 from a subsequent etching process. In this exemplary embodiment, spacer layer 80 extends into trench 46 and is in contact with top surface 51 of insulative layer 26. Spacer layer 78 decreases or narrows the size of a dimension (e.g., width, length, shape, size, etc.) of trench 46.

Figure 11:
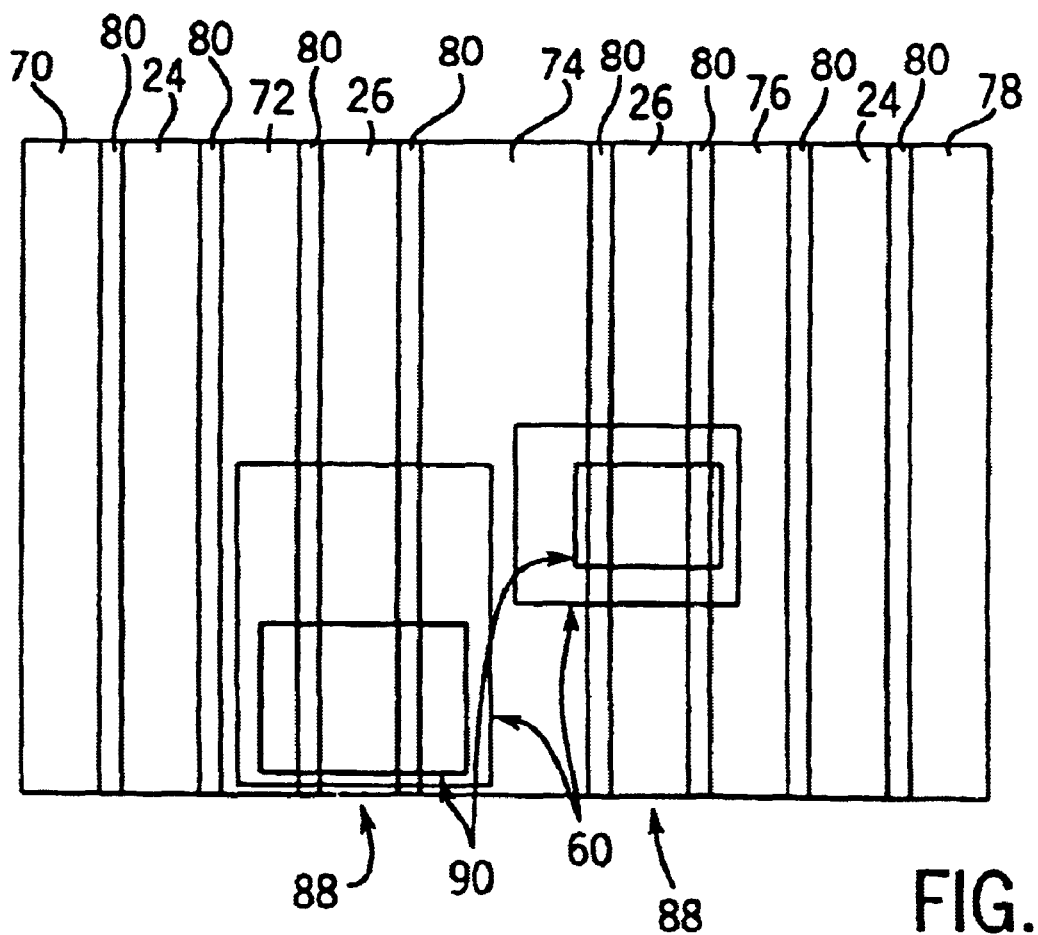
FIG. 11 is a schematic top view of the integrated circuit of FIG. 1, illustrating a via mask step, according to an exemplary embodiment.

Referring now to FIG. 11, a via mask having apertures 60 is applied. The via mask is a non-critical mask which covers all areas of portion 10 except those in which vias are to be etched through layer 26. In this exemplary embodiment, apertures 60 are rectangular and can be twice the size or more of apertures in a conventional dual damascene mask. If apertures 60 are oversized, the apertures will extend over metal layers 34 or 28, which will act as a hard mask. Thus, a less critical via mask can be used. Since long, parallel trenches 88 were fabricated in first insulative layer 24, the via mask defines the starting point and ending point along trenches 88 at which vias will be defined by etching through second insulative layer 26. A small box 90 illustrates the critical via size needed in a conventional dual damascene process, and is illustrated solely for comparison purposes.

Figure 10:
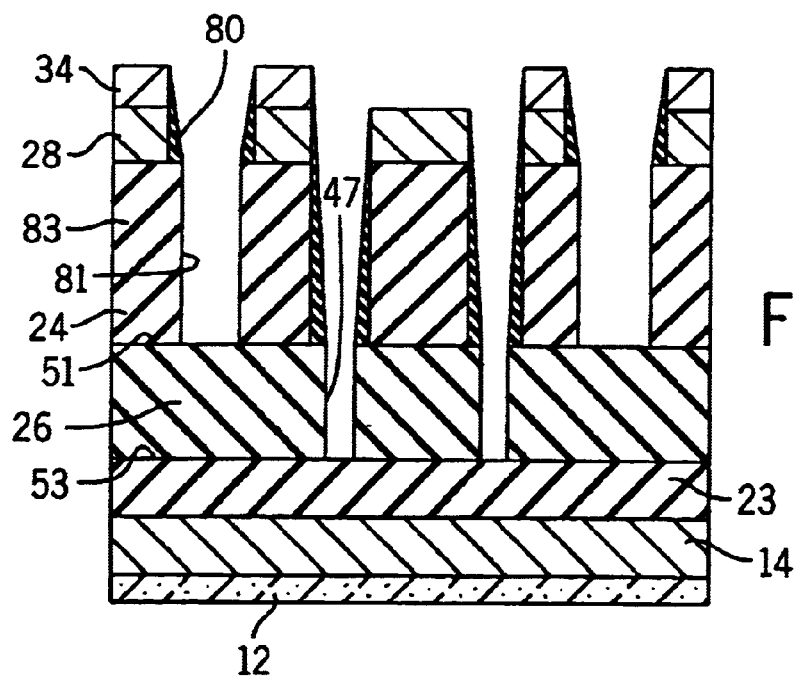
FIG. 10 is a schematic cross-sectional view of the integrated circuit of FIG. 1 illustrating a spacer layer etching step, according to an exemplary embodiment.

Referring to FIG. 10, an etch step selective to insulative layer 24 and insulative layer 26 is provided, using layers 28 and 34 and spacer layer 80 as a hard mask. The etchant forms trench 47, which is preferably 30–50 nm wide and 200–500 nm deep. Trench 47 extends from upper surface 51 of insulative layer 26 to upper surface 50 of etch stop layer 23. In this exemplary embodiment, fabricated layer 14 includes an etch stop or metal cap layer 23 which acts as an etch stop layer for the etching step. Etch stop layer 23 prevents the etchant from removing portions of fabricated layer 14. If etch stop layer 23 is conductive, it may remain in place. If not, it must be removed by a stripping process or other conventional removal step. An additional trench 81 is fabricated in a portion 83 of insulative layer 24. Trench 81 has a width of between 30 and 50 nm, or less than 100 nm. Trench 81 serves as a metal line within layer 16, while trench 18 serves as an electrical contact between layers 14 and 17.

Referring again to FIG. 1, metal layers 28 and 34 and spacer layer 80 are removed (e.g., by etching with an etchant that does not etch layers 24 or 26, or by some other technique, such as, wet etching in $HNO_3$ or $H_2SO_4$, depending on the composition of metal layers 28 and 34). After metal layers 28 and 34 are removed, metal cap layer 23 is removed by anisotropic etching. Trench 46 is filled with conductive material 20 by metal deposition and planarization. Subsequently, metal interconnect lines can be fabricated to provide conductivity between conduction material 20 and other portions of the IC.

Advantageously, using a self-assembled molecular layer in a dual damascene process with spacers allows reduction of the width or widths of trench 46 beyond that capable with prior dual damascene processes.

While the exemplary embodiments illustrated in the FIGS. and described above are presently preferred, it should be understood that these embodiments are offered by way of example only. For example, self-assembled molecular layer technology is relatively young, and additional improvements in the technology are expected. Such improvements will certainly find applications in the teachings herein. Various alkanethiolates, thiols, and other chemical structures may be suitable for forming a self-assembled molecular layer, and are contemplated herein. Accordingly, the present invention is not limited to a particular embodiment, but extends to various modifications that nevertheless fall within the scope of the appended claims.

What is claimed is:

1. A method of fabricating a trench for an interconnect layer of an integrated circuit having first and second insulative layers, comprising:

providing a layer of material over the insulative layers;

forming a first self-assembled monolayer on the layer of material;

etching the first self-assembled monolayer to form a first aperture in the layer of material;

etching the first insulative layer through the first aperture, wherein a top surface of the second insulative layer is exposed;

depositing a spacer layer over the layer of material, wherein a portion of the spacer layer masks a portion of the top surface of the second insulative layer; and etching the second insulative layer.

2. The method of claim 1, wherein the portion of the spacer layer extends into the first aperture and contacts the top surface of the second insulative layer.

3. The method of claim 1, wherein the step of etching the first insulative layer etches a first portion of the trench, wherein the step of etching the second insulative layer etches a second portion of the trench, wherein the first portion of the trench has a width larger than the second portion of the trench.

4. The method of claim 3, wherein the first portion of the trench has a width of less than 2000 Å and the second portion of the trench has a width of less than 1500Å.

5. The method of claim 1, further comprising:

forming a second self-assembled monolayer on the layer of material and within the first aperture; and etching the second self-assembled monolayer to form pillars in the layer of material, wherein the spacer layer is deposited over the pillars.

6. The method of claim 1, further comprising etching the spacer layer to remove the spacer layer from a portion of the top surface of the second insulative layer.

7. The method of claim 1, wherein the layer of material includes gold or silver and the self-assembled monolayer includes a thiol.

8. The method of claim 1, wherein the spacer layer is a metal layer.

9. The method of claim 8, wherein the spacer layer has a thickness of between 20 and 40 nm.

10. The method of claim 1, further comprising providing a via mask before the step of etching the second insulative layer, wherein the step of etching the first insulative layer includes etching a trench, wherein the step of etching the second insulative layer includes etching a via in the second insulative layer.

11. The method of claim 1, wherein the layer of material includes a first metal layer and a second metal layer.

12. The method of claim 11, wherein the first metal layer is patterned over the second metal layer to form areas of changing topography.

13. The method of claim 12, wherein the self-assembled monolayer is provided over the areas of changing topography, wherein the self-assembled monolayer forms areas of etch selectivity at the areas of changing topography.

14. A method of fabricating a trench for an interconnect layer of an integrated circuit, comprising:

providing first and second insulative layers over a semiconductor substrate;

fabricating a layer of material having a topographical transition region over the first insulative layer;

forming a self-assembled molecular layer over the layer of material, wherein the self-assembled molecular layer has a region of etch selectivity at the topographical transition region;

etching the self-assembled molecular layer at the region of etch selectivity to form an aperture in the layer of material;

etching the first insulative layer to form a first portion of the trench;

depositing a spacer layer over the layer of material;

etching the spacer layer to expose a top surface of the second insulative layer; and etching the second insulative layer to form a second portion of the trench.

15. The method of claim 14, wherein the first and second insulative layers have an etch selectivity of at least 2:1.

16. The method of claim 14, wherein the spacer layer includes a metal.

17. The method of claim 14, further comprising:

forming a second self-assembled molecular layer over the layer of material and within the aperture; and etching the second self-assembled molecular layer to form pillars in the layer of material, wherein the spacer layer is provided over the pillars.

18. The method of claim 14, wherein the spacer layer is between 20 and 40 nm thick.

19. A method of fabricating an interconnect layer of an integrated circuit having a trench, the method comprising the steps of:

providing first and second insulative layers above a substrate;

providing a layer of material above the insulative layers;

forming a first self-assembled monolayer on the layer of material;

etching the first self-assembled monolayer to form an aperture in the layer of material;

etching the first insulative layer through the first aperture, wherein a top surface of the second insulative layer is exposed;

providing a spacer layer over the layer of material, wherein a portion of the spacer layer masks a portion of the top surface of the second insulative layer; and etching the second insulative layer to form a trend in the second insulative layer.

20. The method of claim 19, wherein the step of etching the first insulative layer etches a first portion of the trench, wherein the step of etching the second insulative layer etches a second portion of the trench, wherein the first portion of the trench has a width larger than the second portion of the trench.

21. The method of claim 19, further comprising:

forming a second self-assembled monolayer on the layer of material and within the first aperture after the first etching step; and etching the second self-assembled monolayer to form pillars in the layer of material, wherein the spacer layer is deposited over the pillars.

22. The method of claim 19, further comprising: providing a non-critical via mask after the providing the spacer layer step, wherein the non-critical via mask defining end points of the trench in the second insulative layer.

* * * * *